(12) United States Patent
Lee et al.

(10) Patent No.: US 8,174,056 B2
(45) Date of Patent: May 8, 2012

(54) SUBSTRATE-LEVEL INTERCONNECTION AND MICRO-ELECTRO-MECHANICAL SYSTEM

(75) Inventors: Sheng-Ta Lee, Hsin-Chu (TW); Chuan-Wei Wang, Hsin-Chu (TW); Hsin-Hui Hsu, Hsin-Chu (TW)

(73) Assignee: Pixart Imaging, Inc., Hsin-Chu (TW)

( * ) Notice: Subject to any disclaimer, the term of this patent is extended or adjusted under 35 U.S.C. 154(b) by 185 days.

(21) Appl. No.: 12/435,626

(22) Filed: May 5, 2009

(65) Prior Publication Data
US 2010/0283088 A1 Nov. 11, 2010

(51) Int. Cl.
*H01L 29/84* (2006.01)

(52) U.S. Cl. .................. 257/254; 257/E29.324

(58) Field of Classification Search ............... 257/254, 257/414, E29.324
See application file for complete search history.

(56) References Cited

U.S. PATENT DOCUMENTS

| 6,012,336 A | 1/2000 | Eaton et al. |
|---|---|---|
| 2003/0013253 A1* | 1/2003 | Hurley ................. 438/257 |
| 2004/0012057 A1 | 1/2004 | Bennett et al. |
| 2010/0044147 A1* | 2/2010 | Wang ................. 181/164 |
| 2010/0149625 A1* | 6/2010 | Lu et al. ................ 359/291 |

* cited by examiner

*Primary Examiner* — Lex Malsawma
(74) *Attorney, Agent, or Firm* — Tung & Associates

(57) ABSTRACT

A micro-electro mechanical system (MEMS) is disclosed, which comprises a substrate; at least one transistor formed on the substrate and electrically connected with a contact plug; at least one MEMS device; and a local interconnection line at the same level of the contact plug, through which the MEMS device is coupled to the transistor.

11 Claims, 9 Drawing Sheets

US 8,174,056 B2

SUBSTRATE-LEVEL INTERCONNECTION AND MICRO-ELECTRO-MECHANICAL SYSTEM

FIELD OF INVENTION

The present invention relates to a substrate-level interconnection and a micro-electro-mechanical system (MEMS) In the MEMS, a MEMS device is electrically connected with a microelectronic circuit via a local metal interconnection line, the local metal interconnection line being at the same level of a contact plug. The term "local interconnection line" in the context of this invention is not exactly the same as how it is used conventionally, because it does not necessarily include a conventional first metal layer. In the present invention, the local interconnection line is formed primarily by a contact layer; that is, the contact layer forms lines, not only plugs. Because the local interconnection line formed by the contact layer is lower than the conventional first metal layer and very close to the substrate, it is also referred to as "substrate-level interconnection".

DESCRIPTION OF RELATED ART

MEMS devices are used in a wide variety of products such as micro-acoustical sensor, gyro-sensor, accelerometer, etc. MEMS devices are typically integrated with other microelectronic circuits. FIG. 1A is a top view showing a prior art MEMS 2 which includes a CMOS circuit 6 and a MEMS structure 8; the MEMS 2 for example can be a gyro-sensor. The MEMS structure 8 is electrically connected with a CMOS circuit 6 via a first or higher level metal layer 16A/16B; a contact plug 14 and a via plug 18 are also shown in the figure.

Now referring to FIG. 1B, which is across-section view along the line A-A' in FIG. 1, a field effect transistor (FET) is formed on a substrate 20, the FET comprising a gate dielectric layer 22, a gate 24, and source/drain 26. A contact hole is formed in a dielectric layer 27 on the substrate 20 to expose the source or drain 26, which is filled with a contact plug 14. Next, a first metal layer is formed above the contact plug, forming a first level metal interconnection line 30. A portion of the MEMS structure 34 is electrically connected with the FET via the first metal interconnection line 30 or an interconnection line formed by a higher metal layer (not shown). It can be found that the first level metal interconnection line 30 and the contact plug 14 are located at different levels. The first level metal interconnection line 30 is at least one level higher than the contact plug 14.

As widely known, to manufacture a MEMS structure, it is required to form cavities between the metal structures as shown by the reference numbers 36A/36B of FIG. 1B. The cavities 36A/36B were originally insulating layers between the metal structures; these insulating layers were etched away so that a suspended MEMS structure is formed. However, in forming the MEMS structure, the metal interconnection line 30 or higher metal interconnection lines become suspended as well. These suspended metal interconnection lines may cause unstableness of the FET-MEMS integrated system, resulting in reliability issue in the long term. Such issue not only occurs in the MEMS, but also in a CMOS integrated circuit using air as the low dielectric constant insulating layer.

Thus, it is highly desired to provide a more stable substrate-level interconnection for use in the MEMS, or in the CMOS integrated circuit using air as the low dielectric constant insulating layer.

SUMMARY OF THE INVENTION

An objective of the present invention is to provide a substrate-level interconnection and a MEMS to solve the foregoing problem.

In order to achieve the foregoing objective, in one perspective of the present invention, it provides a MEMS comprising: a substrate; at least one transistor formed on the substrate and electrically connected with a contact plug; at least one MEMS device; and a local interconnection line at the same level of the contact plug, through which the MEMS device is coupled to the transistor.

In another perspective of the present invention, it provides a substrate-level interconnection comprising: a substrate; at least one transistor formed on the substrate and electrically connected with a contact plug; and a local interconnection line at the same level of the contact plug.

In the foregoing MEMS and substrate-level interconnection, the insulation between the local interconnection line and the substrate for example can be achieved by: providing an insulating layer made of silicon nitride or silicon oxynitride between the local interconnection line and the substrate; providing a well region in the substrate, the well region having an opposite conduction type to the substrate; or providing a composite layer including a polysilicon layer and a dielectric layer between the local interconnection line and the substrate.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, to show the interrelationships between the process steps and between the layers, but not drawn according to actual scale.

Figure 2:
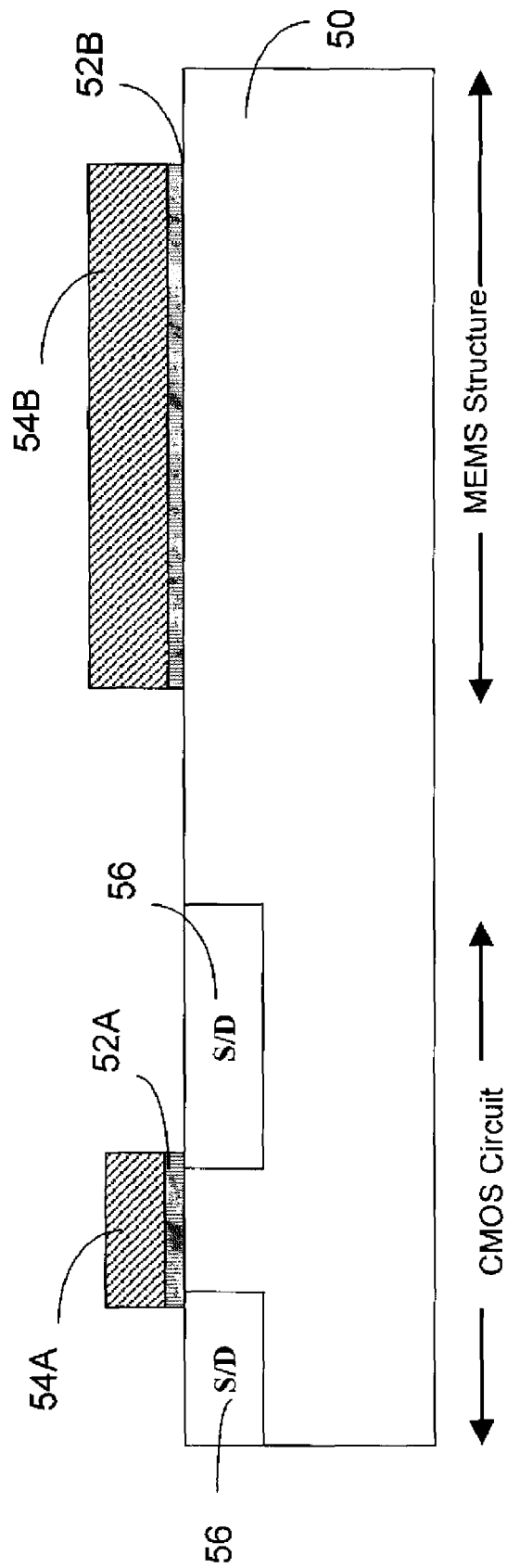
FIGS. 2-6 show the first embodiment of the present invention.

First referring to FIG. 2, the first embodiment of the present invention is illustrated. In this embodiment, a wafer substrate 50, such as a p type silicon substrate, is provided. Next, a field effect transistor (FET) is formed on a CMOS circuit region of the substrate by a standard MOS manufacturing process, the FET including a gate dielectric layer 52A, gate 54A, and source/drain 56. A composite layer including layers 52B and 54B is formed in a MEMS device region as well. The gate dielectric layer 52A and the layer 52B for example may be made of a material such as silicon oxide; the gate 54A and the layer 54B for example may be made of a material such as polysilicon. Depending on the device structure of the FET, the gate dielectric layer 52A and the layer 52B may be made of a material with high dielectric constant. The polysilicon layer 52B is preferably undoped.

The gate dielectric layer 52A is formed by thermal oxidation of the silicon substrate 50, whose thickness for example is between 10 and 100 Å. The gate 54A is formed by photolithography and active ion plasma etch of the polysilicon layer. The polysilicon layer is formed by low pressure chemical vapor deposition (LPCVD), whose thickness is preferably between 1000 and 3000 Å.

Figure 3:
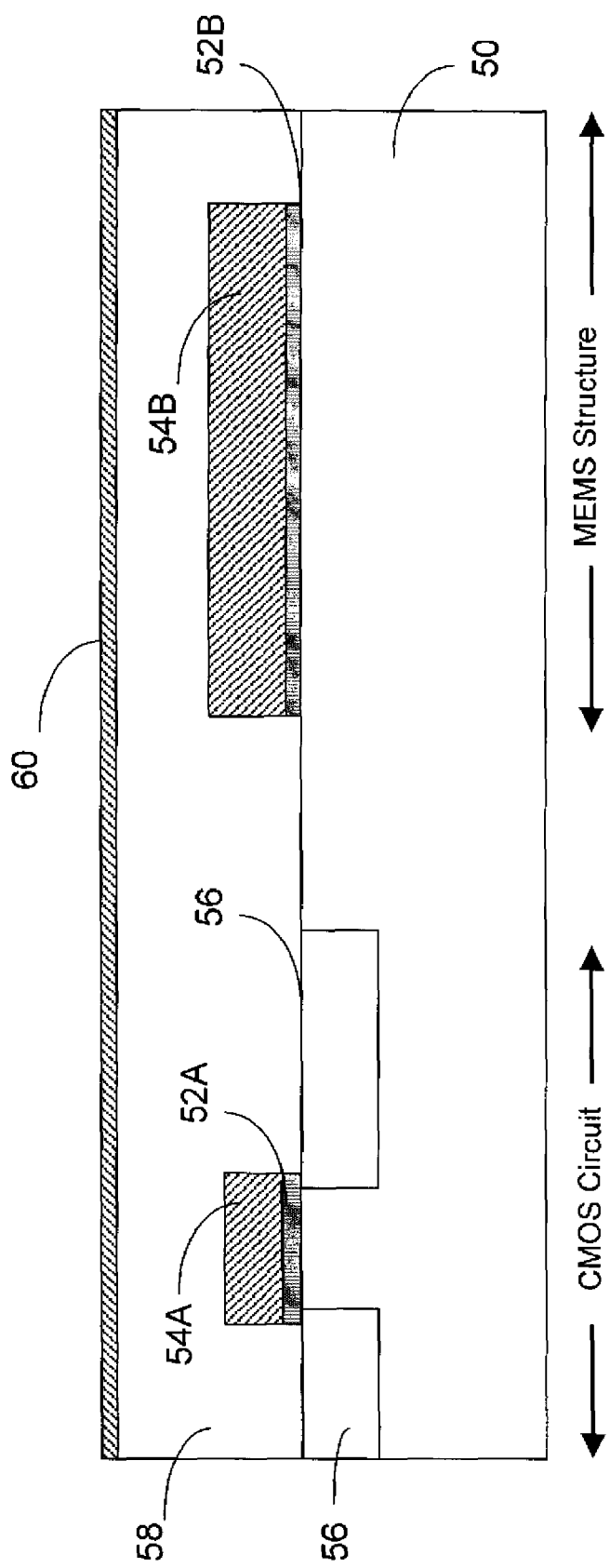

Referring to FIG. 3, a dielectric layer 58 is deposited, and a thin protection layer 60 can be optionally formed if required. The dielectric layer 58 is planarized by, for example, chemical mechanical polishing (CMP) or thermal reflow. As one example, the dielectric layer 58 can be formed by undoped silicon dioxide with LPCVD, whose thickness is preferably between 3000 and 8000 Å. As other examples, the dielectric layer 58 can be formed by boron and phosphorous doped silicon dioxide or phosphorous doped silicon dioxide, by atmospheric pressure chemical vapor deposition (APCVD) or sub-atmospheric pressure chemical vapor deposition (SACVD), whose thickness is preferably between 3000 and 8000 Å. The protection layer 60 can be made of silicon nitride with LPCVD or plasma enhance chemical vapor deposition (PECVD), whose thickness is preferably between 100 and 500 Å. Since the protection layer 60 is provided to resist the etchant subsequently used for forming MEMS devices, such as hydrogen fluoride (HF), the etching characteristic of the protection layer 60 should be considerably different from the dielectric layer 58.

Figure 1A:
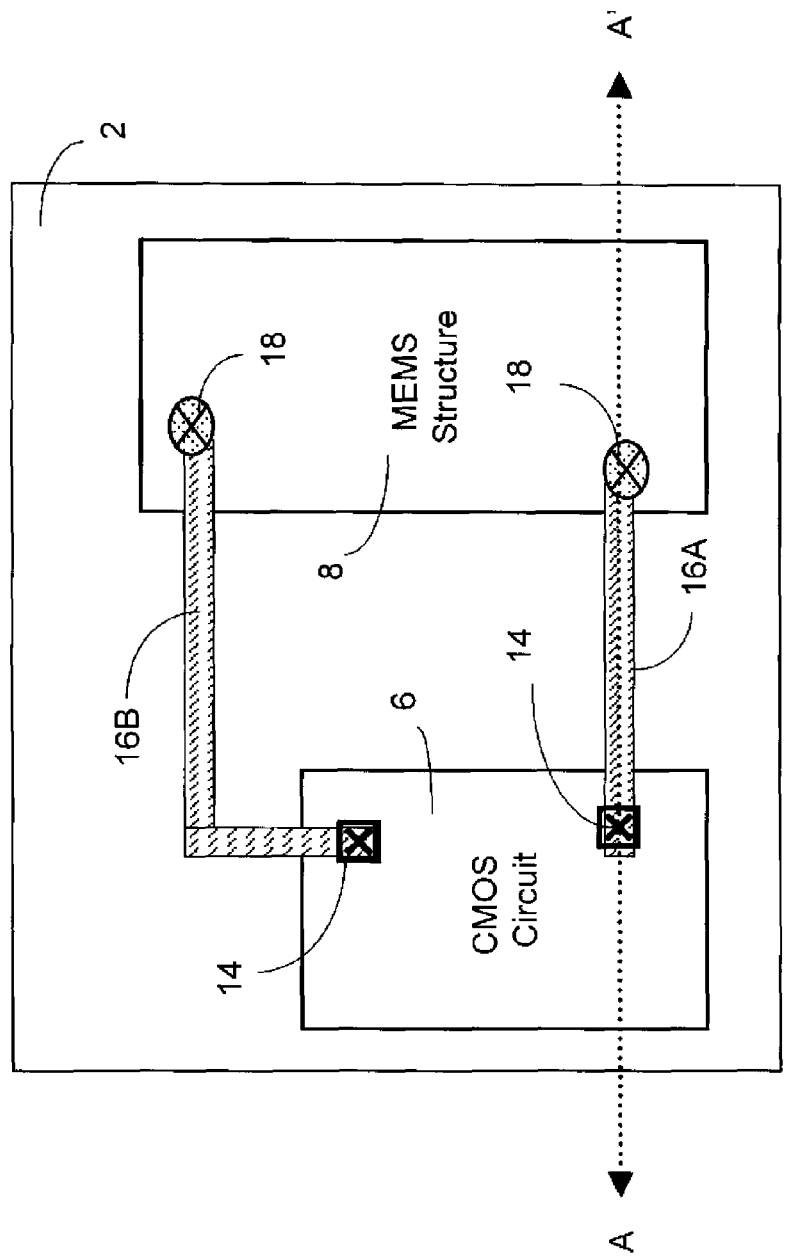
FIGS. 1A-1B show the layout and cross section of a prior art MEMS chip.
Figure 1B:
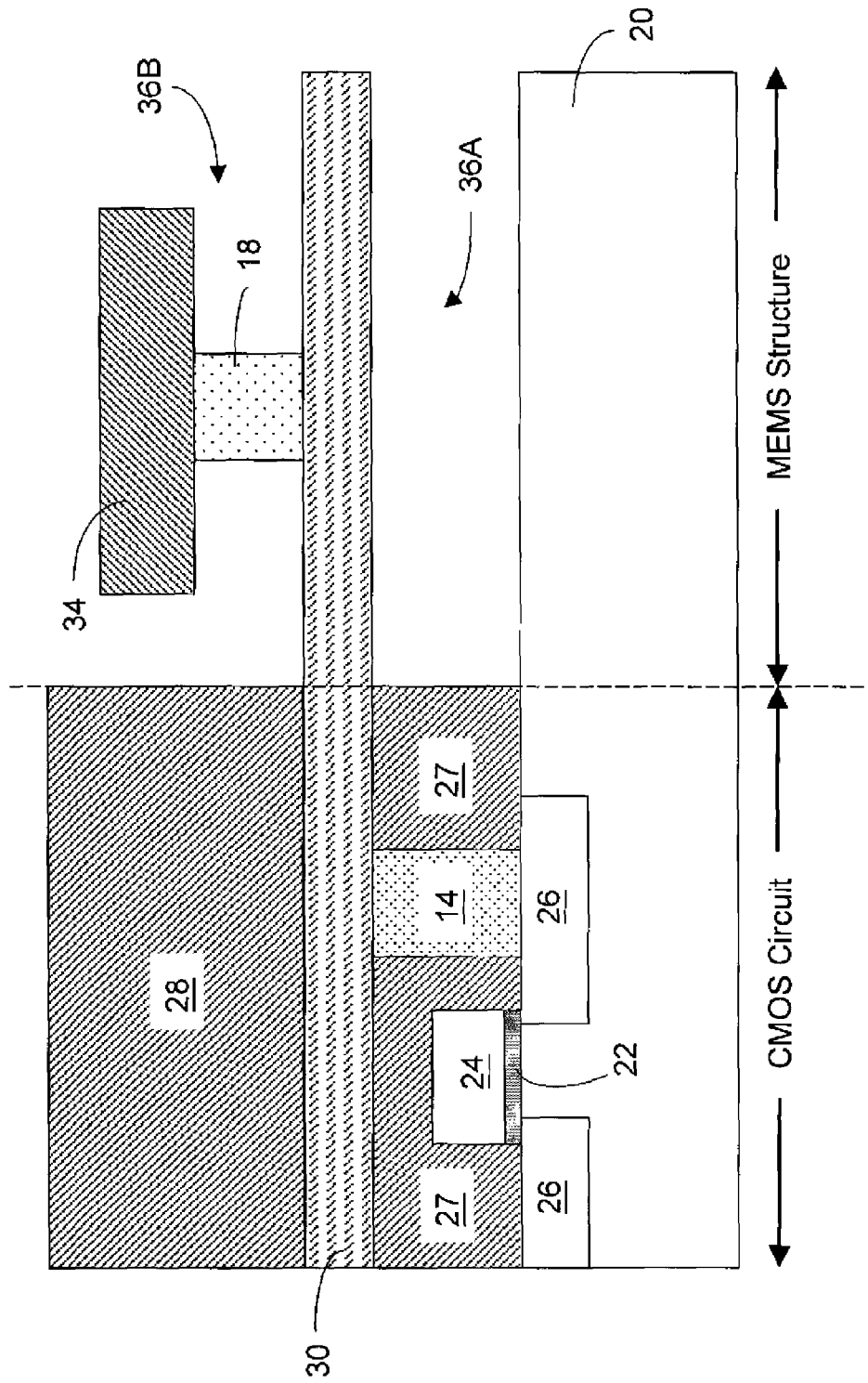
Figure 4:
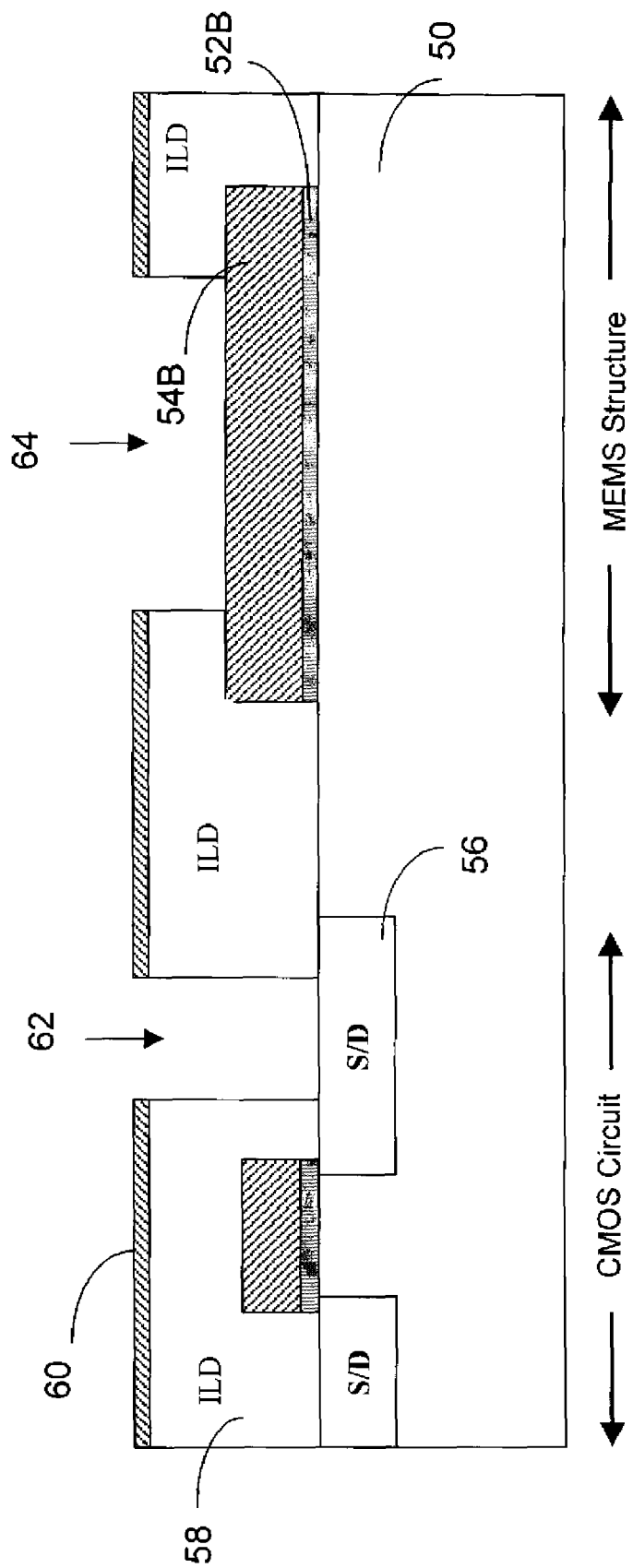
Figure 5:
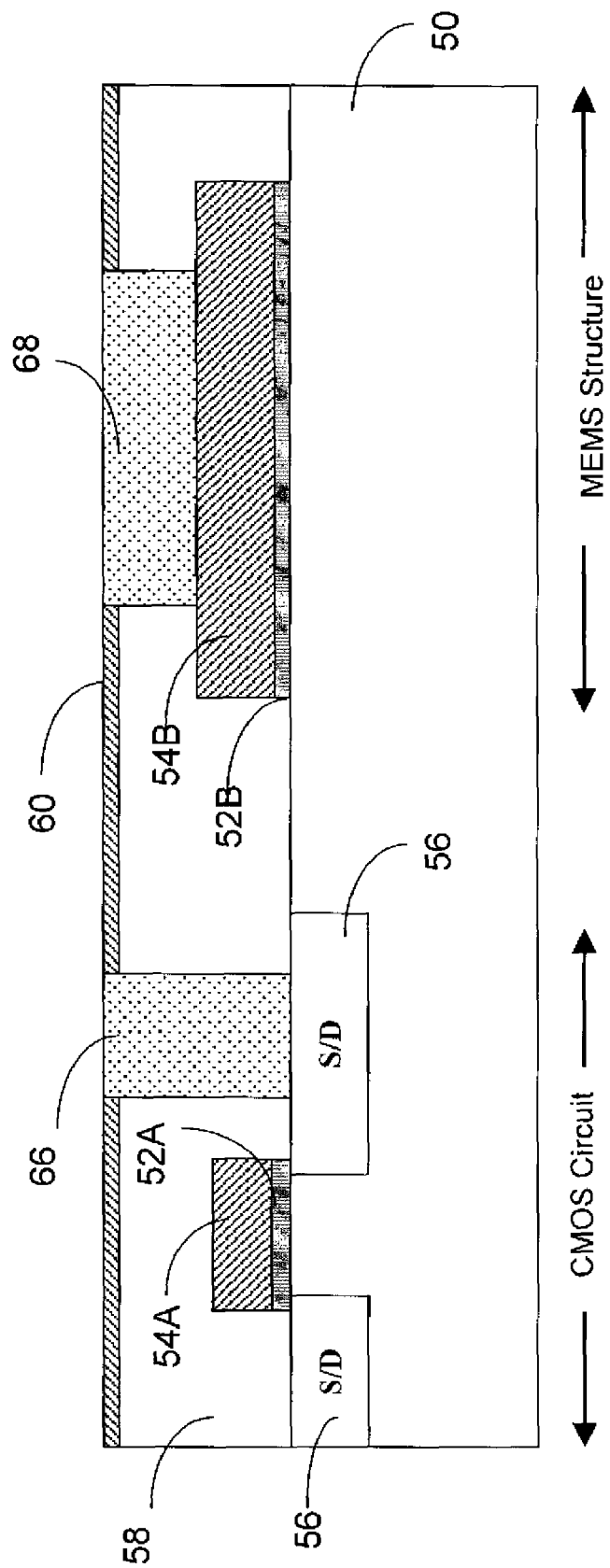

Now please refer to FIGS. 4 and 5. A contact hole 62 is formed in the dielectric layer of the CMOS circuit area, and a trench 64 is formed in the dielectric layer of the MEMS device area concurrently, by steps of photolithography, etch and so on, as shown in FIG. 4, wherein the etch step can be anisotropic plasma etch, for example. The source or drain 56 is exposed under the contact hole 62. Under and exposed at the bottom of the trench 64 are the silicon oxide layer 52B and the polysilicon layer 54B. The trench 64 is provided for forming the local interconnection line in a subsequent step, and the silicon oxide layer 52B and the polysilicon layer 54B are for insulation between the local interconnection line and the wafer substrate. Next, a contact plug 66 is formed in the contact hole 62 in contact with the substrate 50 (the source or drain 56), and a local interconnection line 68 is formed in the trench 64, as shown in FIG. 5. In the MEMS, the local interconnection line 68 provides electrical connection in the MEMS structure area, and it extends to the CMOS circuit area to be coupled to the transistor. The local interconnection line 68 is not the first level metal interconnection line 30 of the prior art in FIG. 1B, but is at the same level of the contact plug 66 (i.e., the local interconnection line 68 and the contact plug 66 are formed by the same material and in the same step). The contact plug 66 and the local interconnection line 68 for example can be made of a material selected from tungsten, aluminum, copper, tungsten alloy, aluminum alloy, and copper alloy, by damascene or plasma etch.

Figure 6:
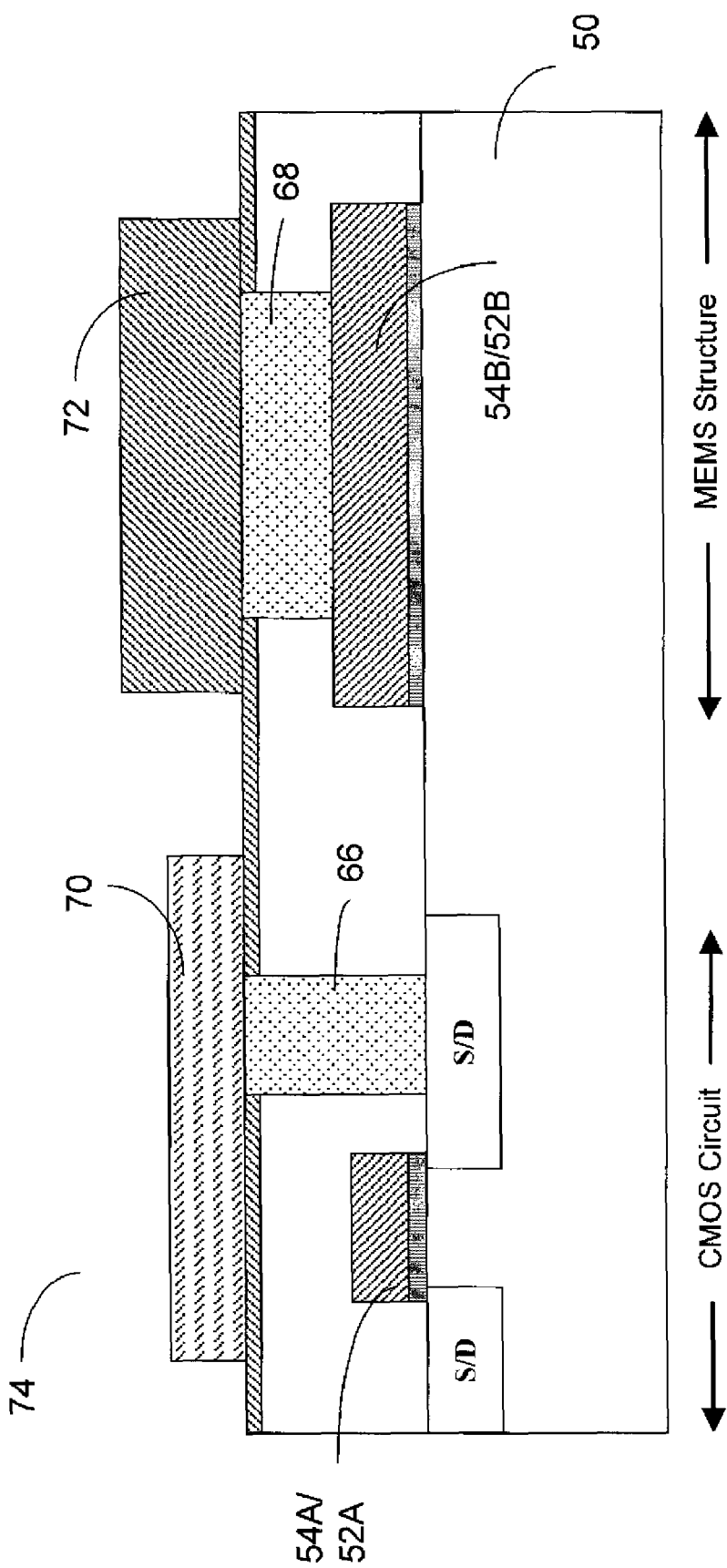

Referring to FIG. 6, next, a first level metal interconnection line 70 and a MEMS structure 72 are formed on the local interconnection line 68. The MEMS structure 72 is electrically connected with the transistor via the local interconnection line 68. Other than the first metal interconnection line 70, a second level metal interconnection line, third level metal interconnection line, forth level metal interconnection line and more can be further formed above the local interconnection line 68 as required; the number of metal layers can be more, and what is shown in the drawings is only an illustrative example. Note that the sequence for forming the MEMS structure 72 and the metal interconnection lines (70 or higher) can be arranged otherwise. In this embodiment, the MEMS structure is formed after the first level metal interconnection line, but it can as well be formed before the first level metal interconnection line according to different types, structures or process requirements of the MEMS device.

It is emphasized here that the local interconnection line 68, which is used for interconnection to electrically connect the MEMS structure 72 and the CMOS circuit area, is not the first level metal interconnection line in the prior art, but at the same level of the contact plug. Since the local interconnection line is very close to the substrate 50, it is also referred to as "substrate-level interconnection" in the present invention. By such structure arrangement, the interconnection in the MEMS structure area does not suspend, and therefore it is more stable than the prior art.

Figure 7:
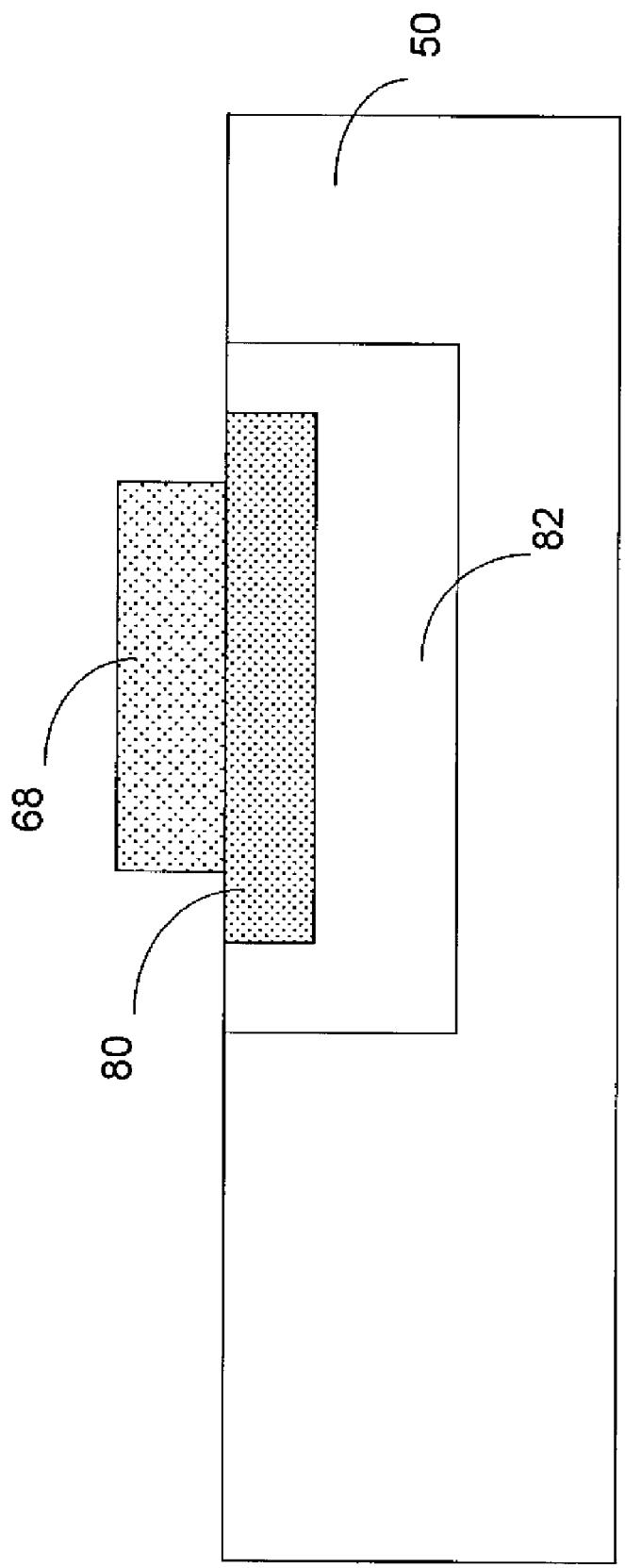
FIG. 7 shows the second embodiment of the present invention.

FIG. 7 discloses the second embodiment. The second embodiment is different from the first embodiment in the insulation between the local interconnection line 68 and the wafer substrate 50. In the embodiment shown in FIG. 7, if the substrate 50 is a P type substrate, $N^+/N^-$ well regions 80/82 can be provided for insulation. The $N^+/N^-$ well regions 80/82 can be formed by ion-implantation with arsenic ions or phosphorous ions according to the required junction effect. The dosage for $N^+$ ion implantation for example is between approximately 1E15 and 1E17 atom/cm$^2$. The dosage for $N^-$ ion implantation for example is between approximately 1E13 and 1E15 atom/cm$^2$. Certainly, if the substrate is of another type, the dopant type and concentration in the well region can be changed.

Figure 8:
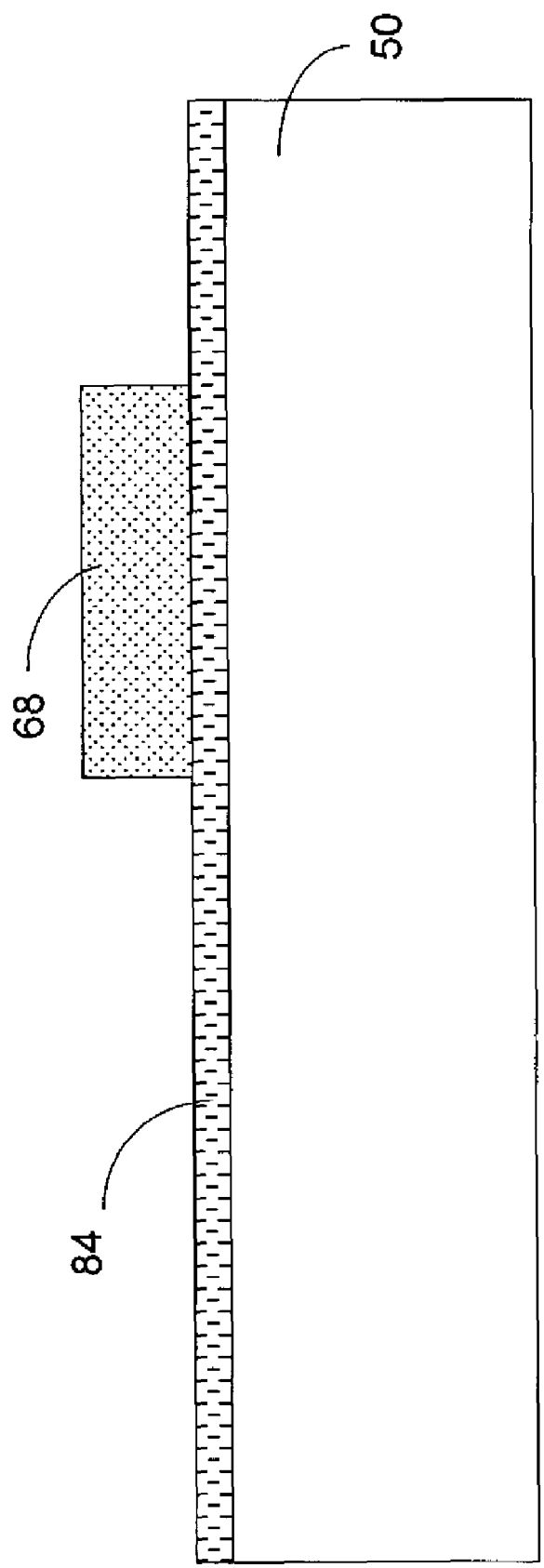
FIG. 8 shows the third embodiment of the present invention.

FIG. 8 discloses the third embodiment. The third embodiment is different from the first embodiment in the insulation between the local interconnection line 68 and the wafer substrate 50. In the embodiment shown in FIG. 8, an insulating layer 84 is provided for insulation, and the local interconnection line 68 is in contact with this insulating layer 84 so that the local interconnection line 68 does not suspend. The insulating layer 84 for example can be formed by silicon nitride with LPCVD or PECVD, whose thickness is preferably between 100 and 1000 Å. Silicon oxynitride is another choice for insulation, which also has good etch selectivity to silicon oxide.

The local interconnection line 68 and corresponding structural arrangement in each of the foregoing embodiments can also be applied in a CMOS integrated circuit using air for low dielectric constant insulating layer.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the materials, number of the metal layers, etch, and other details of the foregoing embodiments can be modified without departing from the spirit of the present invention. In view of the foregoing, the spirit of the present invention should cover all such and other modifications and variations, which should be interpreted to fall within the scope of the following claims and their equivalents.

What is claimed is:

1. A micro-electro-mechanical system (MEMS) comprising:
   a substrate;
   at least one transistor formed in a CMOS circuit area on the substrate and electrically connected with a contact plug;
   at least one MEMS device in a MEMS area, wherein the CMOS circuit area and the MEMS area are separated from one the other; and
   a local interconnection line made of the same material as the contact plug and extending horizontally along the same level of the contact plug from the MEMS area to the CMOS circuit area, through which the MEMS device is coupled to the transistor.

2. The MEMS of claim 1, wherein the transistor includes a gate dielectric layer, a gate, a source, and a drain, and the contact plug is electrically connected with at least one of the source and the drain.

3. The MEMS of claim 1, wherein the local interconnection line is made of a material which includes metal.

4. The MEMS of claim 3, wherein the metal material of the local interconnection line includes one selected from tungsten, aluminum, copper, tungsten alloy, aluminum alloy, and copper alloy.

5. The MEMS of claim 3, wherein the local interconnection line is formed by damascene or plasma etch.

6. The MEMS of claim 1 further including an insulating layer located between the local interconnection line and the substrate, wherein the local interconnection line is in contact with the insulating layer so that it does not suspend.

7. The MEMS of claim 6, wherein the insulating layer is made of a material including silicon nitride or silicon oxynitride.

8. The MEMS of claim 1, wherein at least one well region is provided in the substrate under the local interconnection line.

9. The MEMS of claim 8, wherein the well region includes a lightly doped region having an opposite conduction type to the substrate and a heavily doped region within the lightly doped region.

10. The MEMS of claim 1 further including a composite layer located between the local interconnection line and the substrate, the composite layer having an upper polysilicon layer and a lower dielectric layer.

11. The MEMS of claim 10, wherein the polysilicon layer is undoped and the dielectric layer is made of a material selected from silicon oxide and materials with high dielectric constant.

* * * * *